United States Patent
Aoyama et al.

(10) Patent No.: US 6,252,395 B1
(45) Date of Patent: Jun. 26, 2001

(54) TEMPERATURE-COMPENSATING AMPLIFICATION CIRCUIT AND A POSITION DETECTING APPARATUS USING SUCH AMPLIFICATION CIRCUIT

(75) Inventors: Seiki Aoyama, Toyohashi; Yasuaki Makino, Okazaki; Takeshi Shinoda, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/244,845

(22) Filed: Feb. 4, 1999

(30) Foreign Application Priority Data

Feb. 4, 1998 (JP) .................................... 10-023601
Nov. 27, 1998 (JP) .................................... 10-337245

(51) Int. Cl.⁷ ............................ G01B 7/30; H01L 43/02; G01R 33/05
(52) U.S. Cl. ................................ 324/207.12; 324/207.21; 330/1 R
(58) Field of Search .................. 324/207.12, 225, 324/207.25, 207.21, 235, 252; 338/32 R; 330/1 R, 289, 290, 291

(56) References Cited

U.S. PATENT DOCUMENTS

| | | | |
|---|---|---|---|
| 5,493,219 | 2/1996 | Makimo | 324/207.25 |
| 5,637,995 | 6/1997 | Izawa | 324/174 |
| 5,841,301 | 11/1998 | Horie | 327/100 |

FOREIGN PATENT DOCUMENTS

| | | |
|---|---|---|
| 52-187 | 5/1977 | (JP) . |
| 61-209332 | 3/1985 | (JP) . |
| 2-38920 | 2/1990 | (JP) . |
| 5-71980 | 3/1993 | (JP) . |
| 8-338851 | 12/1996 | (JP) . |

*Primary Examiner*—Walter E. Snow
(74) *Attorney, Agent, or Firm*—Pillsbury Winthrop LLP

(57) ABSTRACT

Magnetic resistive elements 4 and 5 cooperatively detect the change of the magnetic field responsive to the rotation of a gear 2 fixed to a shaft 1. An amplification circuit 6 comprises an operational amplifier 7 having an input terminal to which a gain-determining input resistor 8 is connected. A gain-determining feedback resistor 9 is provided in a feedback path of the operational amplifier 7. The gain-determining resistors 8 and 9 are formed by a P well region and a $P^+$ region of a MOS process element. The temperature characteristics of the gain-determining resistor 8 and 9 are opposed to that of the magnetic resistive elements 4 and 5. The temperature characteristics of the gain of the operational amplifier 7 cancel the temperature characteristics of the magnetic resistive elements 4 and 5.

12 Claims, 13 Drawing Sheets

MEASURED TEMPERATURE CHARACTERISTICS OF GAIN-DETERMINING INPUT RESISTOR

MEASURED TEMPERATURE CHARACTERISTICS OF GAIN-DETERMINING FEEDBACK RESISTOR

MEASURED TEMPERATURE CHARACTERISTICS OF GAIN

MEASURED TEMPERATURE CHARACTERISTICS OF OUTPUT AMPLITUDE

TEMPERATURE-COMPENSATING AMPLIFICATION CIRCUIT AND A POSITION DETECTING APPARATUS USING SUCH AMPLIFICATION CIRCUIT

BACKGROUND OF THE INVENTION

The present invention relates to an amplification circuit for amplifying a sensing signal of a detecting element. For example, the present invention is preferably applicable to a magnetic rotational position detecting apparatus equipped with a magnetic sensing element, such as a magnetic resistive element or a Hall element, and a signal processing circuit processing the waveform of a tiny signal obtained from this magnetic sensing element.

To detect a rotational speed (i.e., a rotational angle) of an automotive engine, conventional engine speed sensors are equipped with an appropriate magnetic resistive element (MRE). The magnetic resistive element faces a gear fixed to the engine output shaft to detect the directional change of a magnetic field responsive to the rotation of the gear. The detected change of the magnetic field is converted into a tiny electric signal having a sine or $\sin^3$ waveform or a rectangular waveform. A waveform processing circuit amplifies the detected signal and compares the amplified signal with a predetermined threshold, thereby producing a binary signal (i.e., a pulse waveform signal) representing the rotational angle of the gear.

In general, the output value of the magnetic resistive element varies in accordance with temperature change. Thus, the magnetic rotational position detecting apparatus needs to have a temperature compensating function for eliminating adverse influence of the temperature change in the output value of the magnetic resistive element. For example, Unexamined Japanese Patent Application No. Kokai 2-38920 or 5-71980 discloses an operational amplifier with a gain-determining resistor having temperature dependency.

However, the temperature compensation realized by these conventional apparatuses is not satisfactory.

The magnetic resistive element has negative temperature characteristics in its output signal. Thus, the amplitude of the amplified sensor signal reduces with increasing temperature, deteriorating the S/N ratio where the S(signal) component is the output signal of the magnetic resistive element and the N(noise) component is a constant circuit error. The sensor output pulse will have worse accuracy in the angle detection.

SUMMARY OF THE INVENTION

An object of the present invention is to provide an amplification circuit having the capability of producing an output not influenced by the temperature characteristics of the sensing element (i.e., the magnetic resistive element).

In order to accomplish this and other related objects, one aspect of the present invention provides an amplification circuit comprising an operational amplifier for inputting a sensing signal from a temperature-dependent element, a gain-determining input resistor connected to an input terminal of the operational amplifier, and a gain-determining feedback resistor disposed in a feedback path extending from an output terminal of the operational amplifier to the input terminal of the operational amplifier. In this arrangement, the temperature characteristics of the gain-determining input resistor and the gain-determining feedback resistor are opposed to that of the temperature-dependent element, and the gain of the operational amplifier is defined by the gain-determining input resistor and the gain-determining feedback resistor so that the temperature characteristics of the gain can cancel the temperature characteristics of the temperature-dependent element. Thus, it becomes possible to provide the amplification circuit capable of producing an amplified output not influenced by the temperature characteristics of the sensing element Preferably, the temperature-dependent element is a magnetic detecting element which detects a magnetic field change responsive to the rotation of a rotor and produces an electric signal representing the detected magnetic field change.

Preferably, the gain-determining input resistor and the gain-determining feedback resistor are different from each other in their temperature characteristics.

Preferably, the gain-determining input resistor and the gain-determining feedback resistor are positive in their temperature characteristics.

Preferably, the gain-determining input resistor and the gain-determining feedback resistor are impurity-diffusion resistive elements. More specifically, the operational amplifier is constituted by a MOS process element having a P well region serving as the gain-determining feedback resistor and a $P^+$ region serving as the gain-determining input resistor. The P well region and the $P^+$ region are located adjacent to each other in a semiconductor substrate.

Another aspect of the present invention provides a position detecting apparatus comprising a movable member made of a magnetic material and having numerous teeth arrayed along a moving direction, the teeth including at least first teeth and second teeth arrayed at different intervals from each other. A bias magnetic field generating means is provided for generating a bias magnetic field adjacent to the movable member. A magnetic resistive element, disposed between the movable member and the bias magnetic field generating means, detects the direction of the bias magnetic field varying in accordance with the movement of the movable member. An amplification circuit, having two kinds of gain-determining resistive elements, amplifies a sensing signal obtained from the magnetic resistive element. A binary signal producing means is provided for converting an amplified signal produced from the amplification circuit into a binary signal based on a comparison between the amplified signal and a predetermined threshold. In this arrangement, the gain-determining resistive elements have temperature characteristics opposed to that of the magnetic resistive element so that the amplified signal produced from the amplification circuit is not substantially influenced by the temperature characteristics of the magnetic resistive element.

Alternatively, the movable member may have a plurality of teeth sections arrayed along the moving direction with non-edged regions separating the teeth sections, each teeth section including a plurality of teeth arrayed at uniform intervals and each non-edged region being formed into an elongated tooth or a toothless region.

Preferably, the temperature characteristics of the gain-determining resistive elements satisfy a requirement that the amplified signal produced from the amplification circuit has a level processible in the binary signal producing means in an operating temperature range of the position detecting apparatus.

Preferably, the movable member is a rotary member with teeth arrayed along its circumferential periphery.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
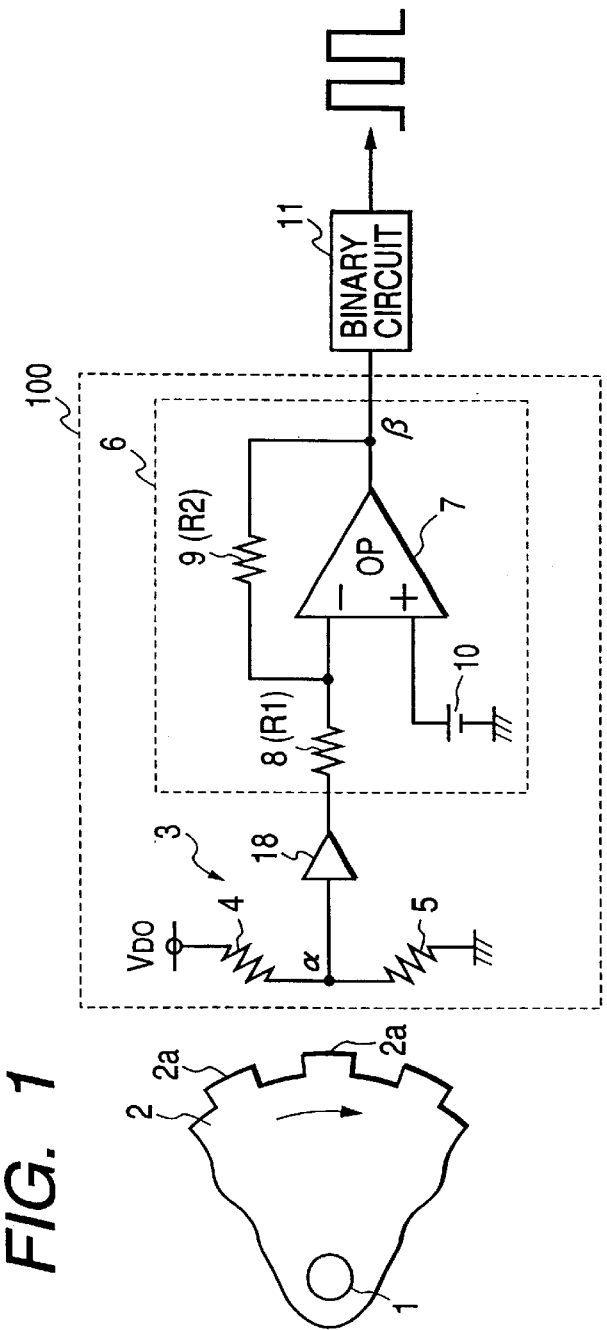
FIG. 1 is a diagram showing the schematic arrangement of a magnetic rotational position detecting apparatus in accordance with a first embodiment of the present invention.

Preferred embodiments of the present invention will be explained hereinafter with reference to attached drawings. Identical parts are denoted by the same reference numerals throughout the views.

First Embodiment

FIG. 1 shows a rotational position detecting apparatus comprising a magnetic rotary sensor and a sensor signal processing circuit, which is preferably installed in an internal combustion engine.

As shown in FIG. 1, a shaft 1 rotates in synchronism with an engine output shaft (not shown). The rotational speed of the shaft 1 is a half of that of the engine output shaft. A gear 2, made of a magnetic material, is securely fixed to the shaft 1. A plurality of teeth 2a are provided along the outer circumferential periphery of the gear 2. A magnetic rotary sensor (i.e., rotational angle sensor) 3 comprises a pair of magnetic resistive elements (i.e., MREs) 4 and 5 serially connected to an electric power source $V_{DD}$ of 5 volts so as to constitute a variable voltage dividing circuit (i.e., bridge circuit). Each resistance value of MREs 4 and 5 is variable in response to the directional change of the magnetic field caused by a rotational displacement of the gear 2 (i.e., rotor). Thus, the rotational displacement of the gear 2 can be detected at an intermediate point α between two MREs 4 and 5 (i.e., an intermediate point of the bridge) as an electrical signal representing the directional change of the magnetic field.

The intermediate point α between two MREs 4 and 5 is connected to an inverting amplification circuit 6 which comprises an operational amplifier 7, a gain-determining input resister 8, a gain-determining feedback resister 9, and a constant-voltage circuit 10. More specifically, the intermediate point α is connected to an inversion input terminal of the operational amplifier 7 via the gain-determining input resister 8. The constant-voltage circuit 10 is connected to the non-inversion input terminal of the operational amplifier 7. An output terminal of the operational amplifier 7 is connected to the inversion input terminal via a negative feedback path. The gain-determining feedback resister 9 is provided in this negative feedback path. A buffer circuit 18, acting as an impedance conversion element, is interposed between the intermediate point α and the inverting amplification circuit 6.

In this inverting amplification circuit 6, the voltage variation (i.e., sensor signal) at the intermediate point α between MREs 4 and 5 is amplified. The signal amplification factor (i.e., gain) of the inverting amplification circuit 6 is $-R2/R1$ which is defined by the resistance value R1 of the gain-determining input resistor 8 and the resistance value R2 of the gain-determining feedback resistor 9.

Figure 2:
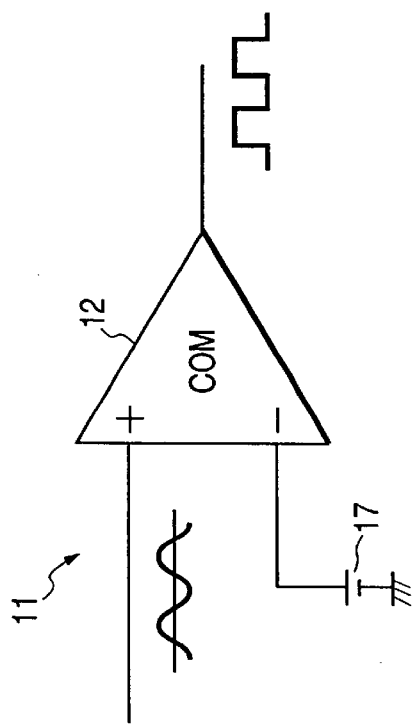
FIG. 2 is a circuit diagram showing an arrangement of a binary circuit shown in FIG. 1.

The output terminal of the operational amplifier 7 is connected to a binary circuit 11. As shown in FIG. 2, the binary circuit 11 comprises a comparator 12. The sensor signal (i.e., the output signal of the operational amplifier 7) is entered to one input terminal of the binary circuit 11. A constant-voltage circuit 17 is connected to the other input terminal. The binary circuit 11 compares an AC waveform value of the sensor signal with a threshold level (i.e., a constant voltage) given by the constant-voltage circuit 17, and produces a binary signal (i.e., a pulse signal) based on the comparison.

Figure 3:
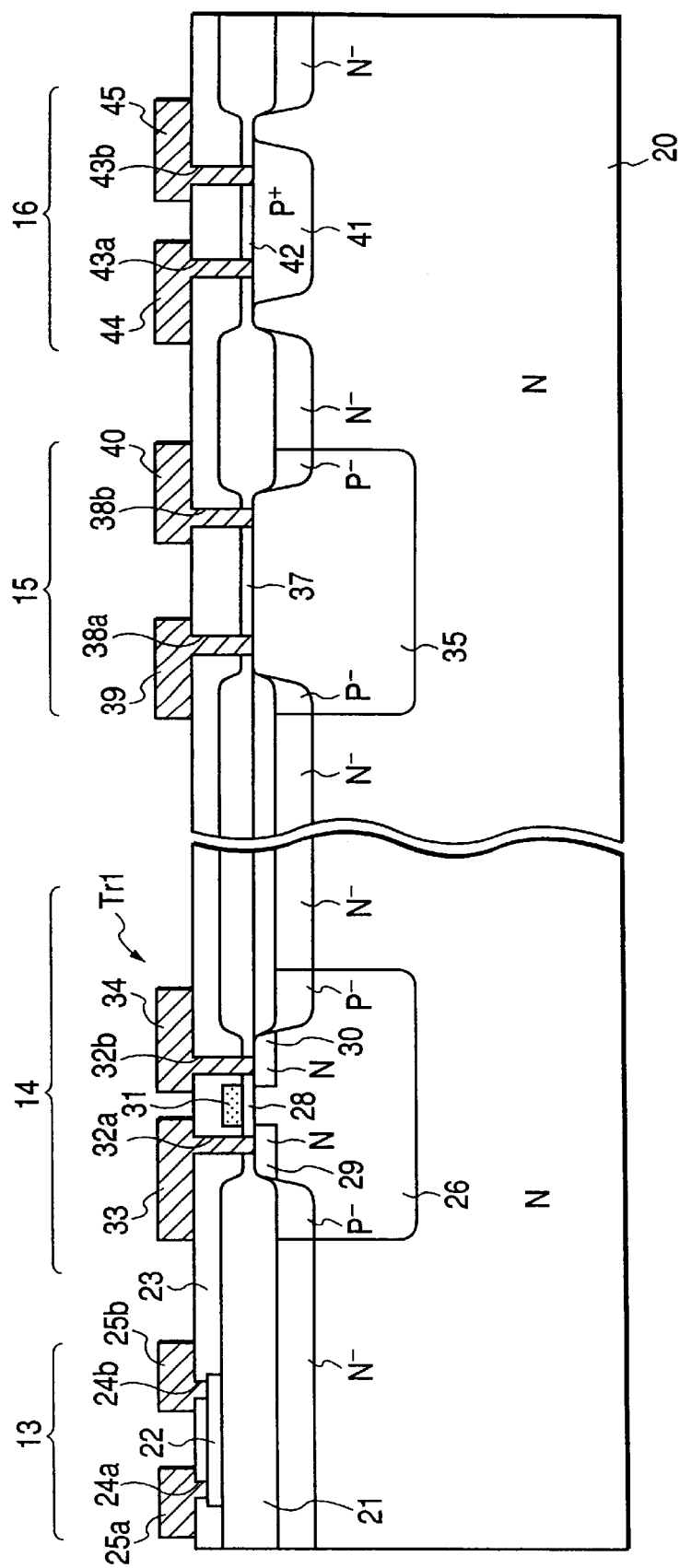
FIG. 3 is a cross-sectional view showing the detailed arrangement of a semiconductor chip shown in FIG. 1.

The MREs 4 and 5, the operational amplifier 7, the gain-determining input resistor 8, and the gain-determining feedback resistor 9 are united into a silicon chip 100. FIG. 3 is a cross-sectional view showing the detailed arrangement of the united silicon chip 100.

In FIG. 3, the silicon chip 100 comprises a MRE region 13, an operational amplifier region 14, a P well resistive region 15 and a P⁺ resistive region 16. The MRE region 13 functions as the MREs 4 and 5. The operational amplifier region 14 functions as the operational amplifier 7. The P well resistive region 15 functions as the gain-determining feedback resistor 9. The P⁺ resistive region 16 functions as the gain-determining input resistor 8.

More specifically, the MRE region 13 comprises an LOCOS oxide film 21 formed on an N-type silicon substrate 20 and a Ni—Co alloy film 22 formed on the LOCOS oxide film 21. The Ni—Co alloy film 22 is a magnetic resistive element (i.e., MRE). A silicon oxide film 23 is formed on the Ni—Co alloy film 22. Aluminum leads 25a and 25b, formed on the silicon oxide 23, are electrically connected to the Ni—Co alloy film 22 via contact holes 24a and 24b extending across the silicon oxide film 23.

The operational amplifier region 14 comprises a P well region 26 formed on the LOCOS oxide film 21. A thin gate silicon oxide film 28 is formed on the top of the P well region 26, instead of providing the LOCOS oxide film 21. A polysilicon gate electrode 31 is disposed on the gate silicon oxide film 28. An N-type source region 29 and an N-type drain region 30 are formed at both sides of the polysilicon gate electrode 31 on the upper surface layer of the P well region 26. Two aluminum leads 33 and 34, formed on the silicon oxide film 23, are electrically connected to the source region 29 and the drain region 30 via contact holes 32a and 32b extending across the silicon oxide film 23, respectively. This arrangement constitutes an N-channel MOS transistor Tr1 which is associated with a resistive element or other elements to function as the operational amplifier 7. In other words, the operational amplifier 7 is formed by a MOS process element. Thus, the inverting amplification circuit 6 serves as a MOS operational amplifier.

The P well resister region 15 comprises a P well region 35 formed on the N-type silicon substrate 20. A thin silicon oxide film 37 is formed on the top of the P well region 35, instead of providing the LOCOS oxide film 21. Two aluminum leads 39 and 40, formed on the silicon oxide film 23, are electrically connected to the P well region 35 via contact holes 38a and 38b extending across the silicon oxide film 23, respectively. The P well region 35 between the aluminum wires 39 and 40 functions as the gain-determining feedback resistor 9.

The P$^+$ resistive region 16 comprises a P$^+$ region 41 formed on the N-type silicon substrate 20. A thin silicon oxide film 42 is formed on the top of the P$^+$ region 41, instead of providing the LOCOS oxide film 21. Two aluminum leads 44 and 45, formed on the silicon oxide film 23, are electrically connected to the P$^+$ resister region 41 via contact holes 43a and 43b extending across the silicon oxide film 23, respectively. The P$^+$ region 41 between the aluminum wires 44 and 45 functions as the gain-determining input resistor 8.

As described above, all of the operational amplifier 7, the gain-determining feedback resistor 9, and the gain-determining input resistor 8 are integrally arranged in the MOS process element. When the gain-determining feedback resistor 9 and the gain-determining input resistor 8 are formed by the P well region and the R$^+$ region of the MOS transistor, their manufacturing process can be simplified. Furthermore, when the resistors 8 and 9 are positioned adjacently from each other in the semiconductor substrate 20, noises propagating in the semiconductor substrate can be canceled. As there is no temperature difference between the two resistors, it becomes possible to realize the temperature characteristics as designed.

An N$^-$ layer, serving as a channel stopper, is provided under the LOCOS oxide film 21, although this N$^-$ layer can be omitted.

The above-described magnetic rotational position detecting apparatus functions in the following manner.

The gear 2 rotates in synchronism with the output shaft of the engine. The resistance values of the MREs 4 and 5 vary in accordance with the directional change of the magnetic field caused by the rotation of the gear 2. Thus, the voltage of the intermediate Point α between the MREs 4 and 5 varies as indicated by an AC waveform in FIG. 4. This voltage is taken out as a rotational angle sensor signal.

Figure 4:
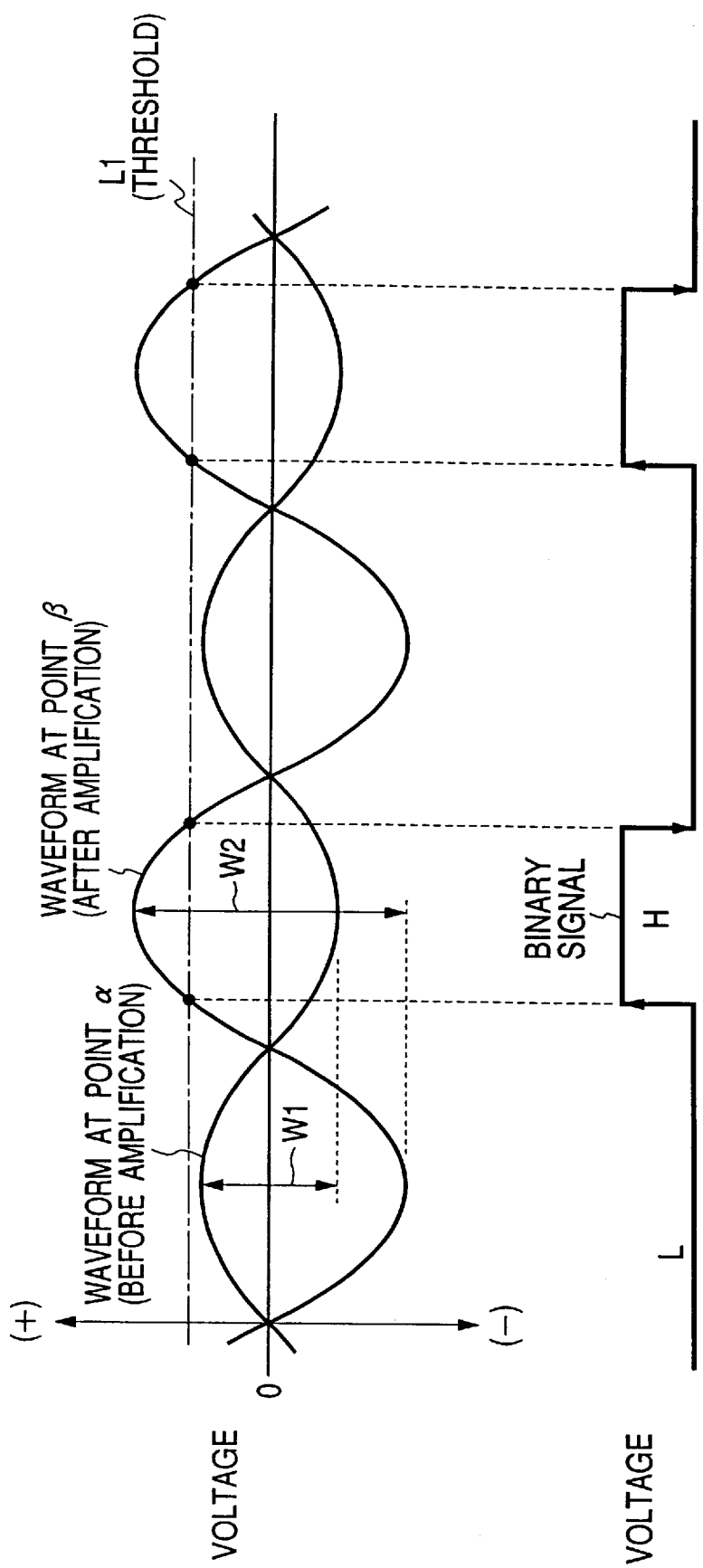
FIG. 4 is a time chart showing the relationship between signal waveforms in the magnetic rotational position detecting apparatus and a setting of threshold.

The inverting amplification circuit 6 amplifies the rotational angle sensor signal with the predetermined amplification factor. The output waveform of the inverting amplification circuit 6, i.e., the signal waveform at an output terminal β of the operational amplifier 7, is −R2/R1 times the sensor output (i.e., the voltage level at the intermediate point α) as shown in FIG. 4.

The output signal of the inverting amplification circuit 6 is entered into the binary circuit 11. The comparator 12 compares the amplified AC sensor signal with the threshold of a constant potential L1, and produces the binary signal based on the comparison. The pulse number of the binary signal is counted by an appropriate counter (not shown) to detect the rotational position of the engine.

In the inverting amplification circuit 6, both the gain-determining input resistor 8 and the gain-determining feedback resistor 9 have temperature dependency in their resistance values. However, according to this embodiment, the temperature dependencies of the MREs 4 and 5 can be canceled by the temperature characteristics of the gain (−R2/R1) of the operational amplifier 7.

The canceling effects of this embodiment will be explained hereinafter.

Figure 5:
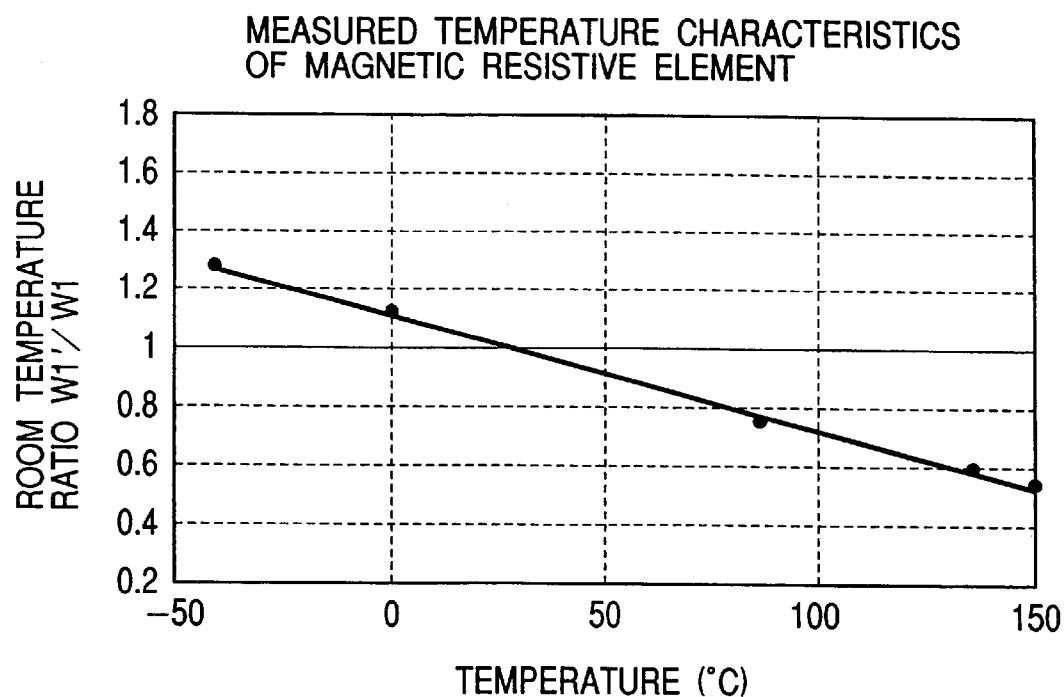
FIG. 5 is a graph showing the measured temperature characteristics of the magnetic resistive element.

FIG. 5 shows the measured temperature characteristics (i.e., sensitivity) of the MREs 4 and 5, which represents the change of the resistance value in accordance with the temperature change. In FIG. 5, the abscissa represents the temperature and the ordinate represents the room temperature ratio. In this case, the room temperature ratio is defined by W1'/W1, where W1 represents the sensor signal amplitude W1 (refer to FIG. 4) at the room temperature (27° C.) and W1' represents the sensor signal amplitude W1' at each measuring temperature. The MREs 4 and 5, made of the Ni—Co alloy film, have negative temperature characteristics of approximately −4,300 ppm/° C. in the resistance change rate as apparent from FIG. 5.

Figure 6:
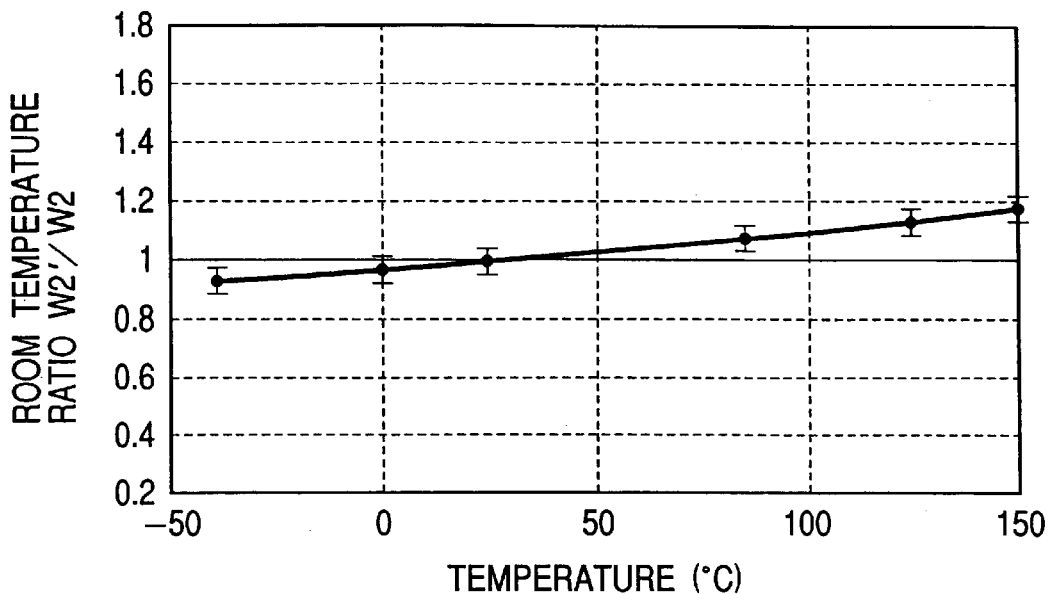
FIG. 6 is a graph showing the measured temperature characteristics of a gain-determining input resistor.

FIG. 6 shows the measured temperature characteristics of the gain-determining input resistor 8. In FIG. 6, the abscissa represents the temperature and the ordinate represents the room temperature ratio. In this case, the room temperature ratio is defined by W2'/W2, where W2 (refer to FIG. 4) represents the amplified sensor signal amplitude at the room temperature (27° C.) and W2' represents the amplified sensor signal amplitude W2' at each measuring temperature, under the condition that a constant-amplitude AC signal is entered into the inverting amplification circuit 6 and the gain-determining feedback resistor 9 has no temperature dependency. The gain-determining input resistor 8, constituted by the P$^+$ region manufactured in the MOS process, has the temperature characteristics of approximately +1,120 ppm/° C. in the resistance change rate as apparent from FIG. 6.

Accordingly, the resistance value R1(T) of the gain-determining input resistor 8 at the temperature T° C. is defined by the following equation (1).

$$R1(T) = R1(27) \times \{1 + 1{,}120 \text{ ppm}/° \text{ C.} \times (T{-}27)\} \quad (1)$$

where R1(27) is a resistance value of the gain-determining input resistor 8 at the temperature 27° C.

Figure 7:
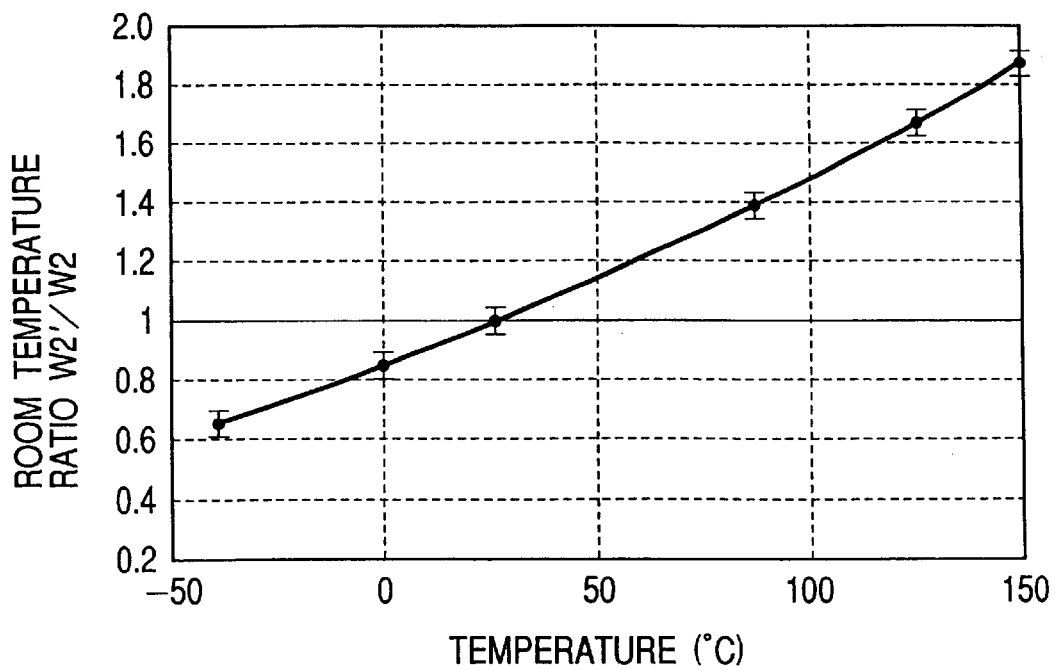
FIG. 7 is a graph showing the measured temperature characteristics of a gain-determining feedback resistor.

FIG. 7 shows the measured temperature characteristics of the gain-determining feedback resistor 9. In FIG. 7, the abscissa represents the temperature and the ordinate represents the room temperature ratio. In this case, the room temperature ratio is defined by W2'/W2, where W2 (refer to FIG. 4) represents the amplified sensor signal amplitude at the room temperature (27° C.) and W2' represents the amplified sensor signal amplitude W2' at each measuring temperature, under the condition that a constant-amplitude AC signal is entered into the inverting amplification circuit 6 and the gain-determining input resistor 8 has no temperature dependency. The gain-determining feedback resistor 9, constituted by the P well region manufactured in the MOS process, has the temperature characteristics of approximately +5,400 ppm/° C. in the resistance change rate as apparent from FIG. 7.

Accordingly, the resistance value R2(T) of the gain-determining feedback resistor 9 at the temperature T° C. is defined by the following equation (2).

$$R2(T)=R2(27)\times\{1+5,400 \text{ ppm}/° \text{ C.} \times(T\text{-}27)\} \quad (2)$$

where R2(27) is a resistance value of the gain-determining feedback resistor 9 at the temperature 27° C.

The gain-determining input resistor 8 and the gain-determining feedback resistor 9 are both positive in their temperature characteristics but different in the coefficient value.

Figure 8:
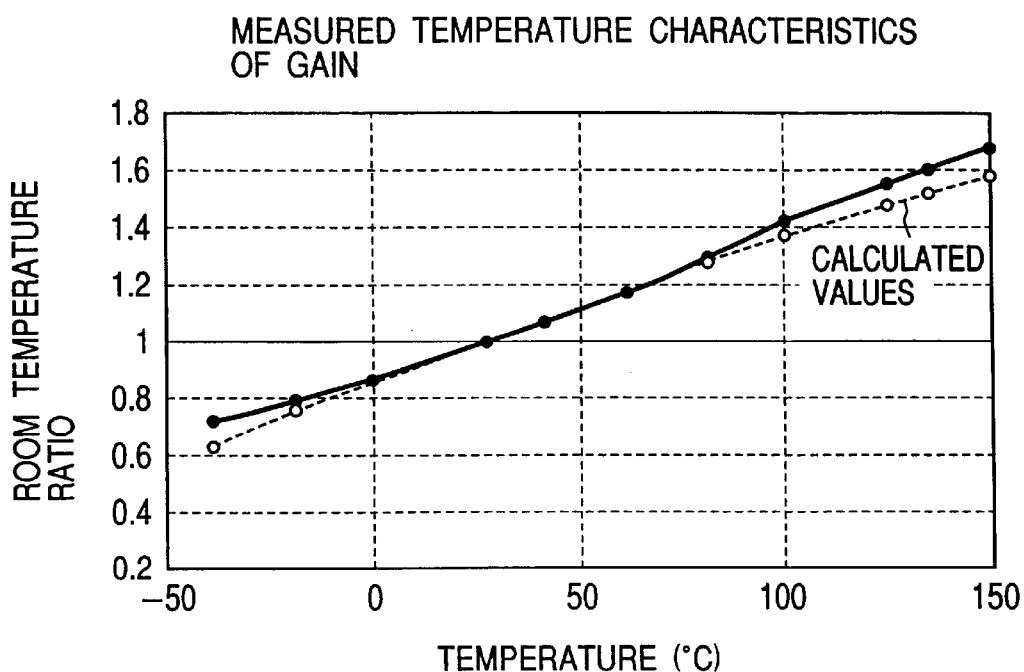
FIG. 8 is a graph showing the measured and calculated temperature characteristics of the gain.

FIG. 8 shows the temperature characteristics of the gain in the inverting amplification circuit 6 constituted by the gain-determining resistors 8 and 9 which are made of impurity diffusion elements different in the temperature characteristics. In FIG. 8, the data plotted by "•" represent the measured values and the data plotted by "○" represent the calculated values obtained from the following equation (3).

$$\text{Gain}=-R2(T)/R1(T)=-[R2(27)\times\{1+5,400 \text{ ppm}/° \text{ C.}\times(T\text{-}27)\}]/[R1(27)\times\{1+1,120 \text{ ppm}/° \text{ C.}\times(T\text{-}27)\}] \quad (3)$$

Figure 9:
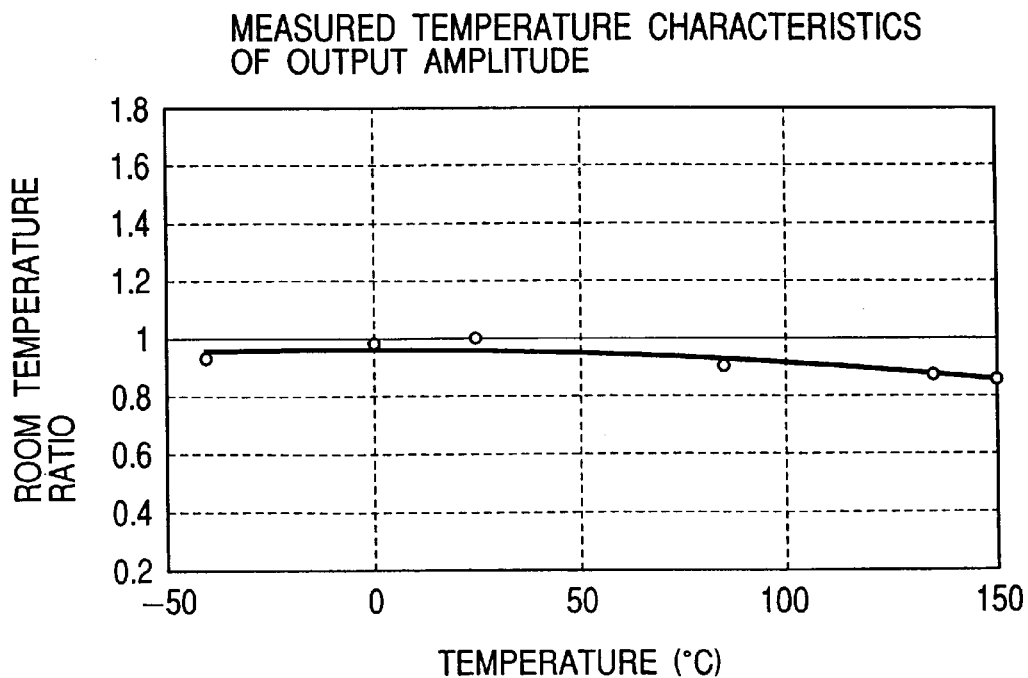
FIG. 9 is a graph showing the measured temperature characteristics of the amplified output amplitude.

FIG. 9 shows the measured temperature characteristics of the amplified output amplitude.

As apparent from FIG. 9, the amplified output amplitude is substantially constant in the temperature range from −40° C. to 150° C. corresponding to a practical operating temperature range of the position detecting apparatus. The largest deviation is about 10% (=(1−0.9)×100%) at the temperature 150° C. In other words, the measurement result shown in FIG. 9 reveals that the temperature characteristics (FIG. 5) of the MREs 4 and 5 can be canceled by the temperature characteristics (FIG. 8) of the gain (−R2/R1) defined by the gain-determining resistors 8 and 9.

Thus, the output signal (i.e., the binary output signal) of the binary circuit 11 is stable even when the temperature varies in a wide range.

The temperature characteristics of respective gain-determining resistors 8 and 9 can be easily changed by adjusting the impurity density of the resistors 8 and 9.

The above-described embodiment can be modified in the following manner.

The MREs 4 and 5, made of the Ni—Co alloy film, can be replaced by other magnetic detecting elements, such as Hall elements.

Figure 10:
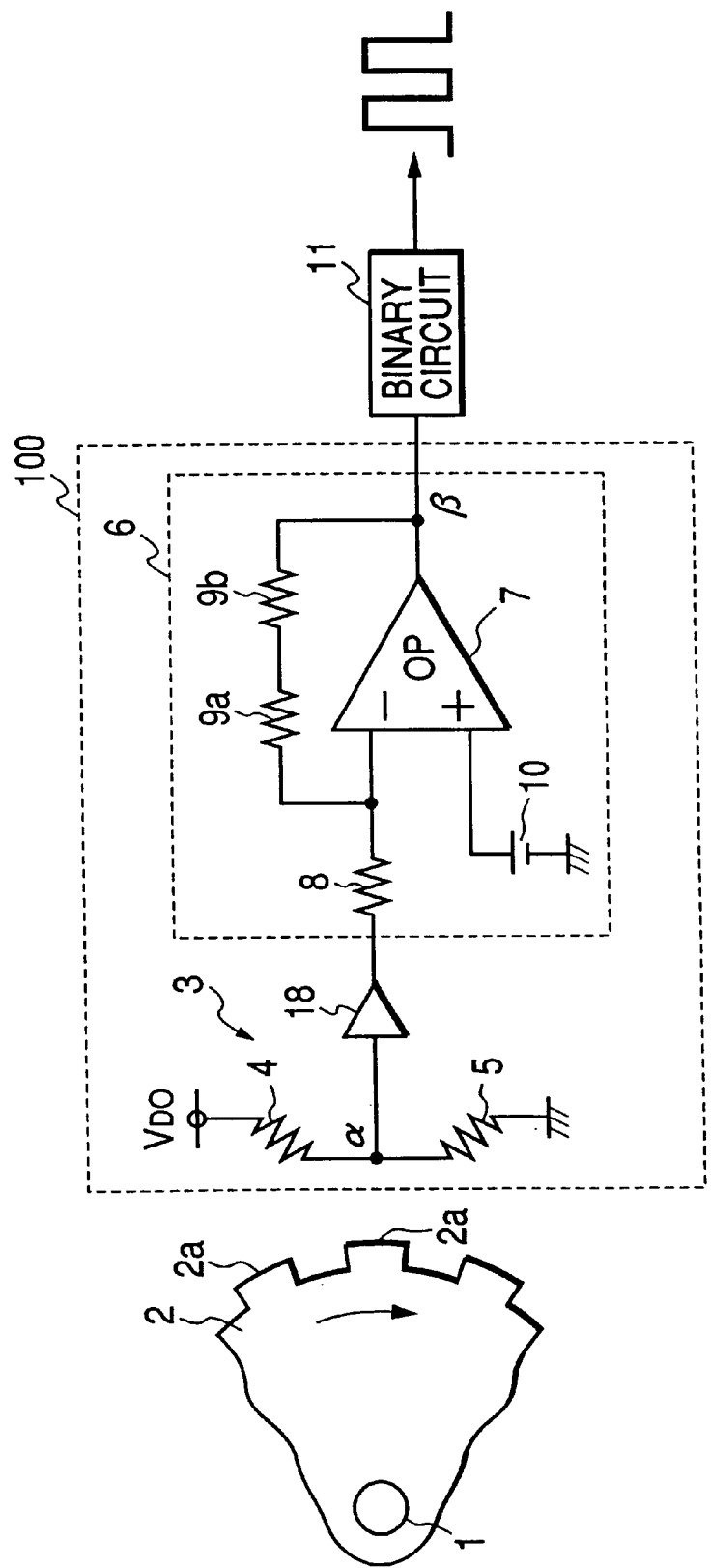
FIG. 10 is a diagram showing the schematic arrangement of another magnetic rotational position detecting apparatus in accordance with the first embodiment of the present invention.
Figure 11:
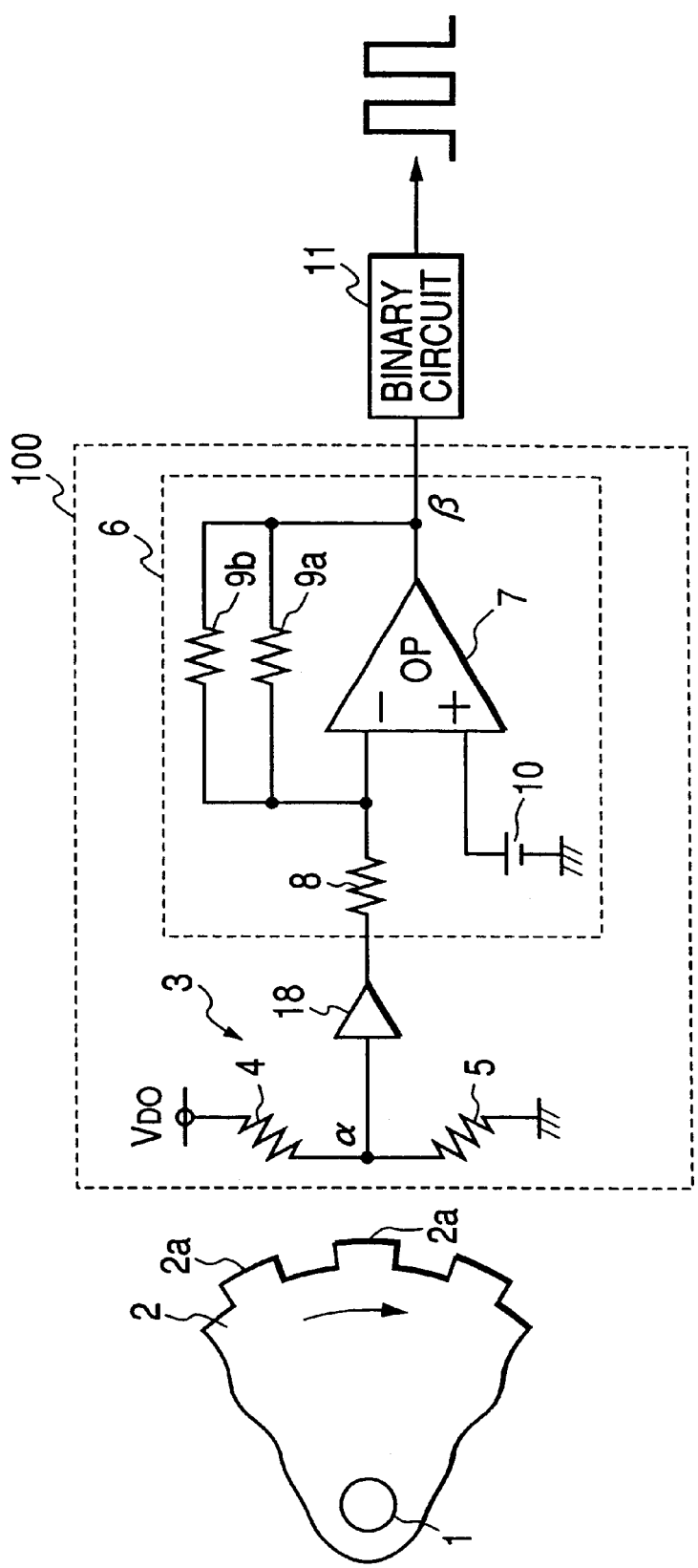
FIG. 11 is a diagram showing the schematic arrangement of another magnetic rotational position detecting apparatus in accordance with the first embodiment of the present invention.

The gain-determining feedback resistor 9 can be replaced by a plurality of resistors 9a and 9b having temperature characteristics different from each other, as shown in FIG. 10 (serial connection) or in FIG. 11 (parallel connection). In this case, it is preferable that one of the resistors 9a and 9b is a fixed resistor and the other is a trimming resistor, so that the temperature compensation value can be adjusted finely.

The gain-determining resistors 8 and 9 can be formed by polysilicon instead of using the impurity-diffusion layer.

The gain-determining resistors 8 and 9 are not limited to the semiconductor process element and, therefore, can be formed by any other elements having adequate temperature characteristics, such as externally-provided resistors (e.g., thermistor chip).

Figure 12:
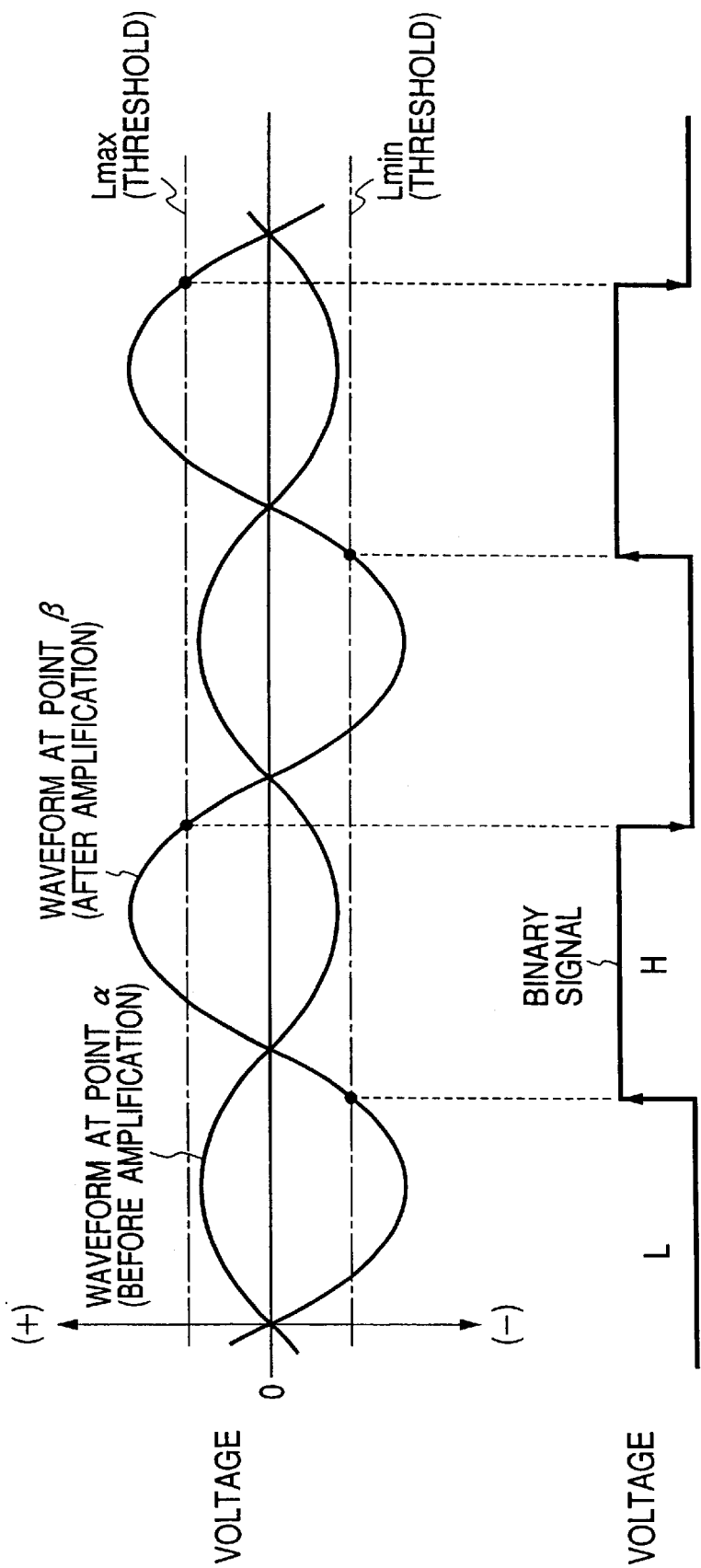
FIG. 12 is a time chart showing the relationship between signal waveforms in the magnetic rotational position detecting apparatus and another setting of threshold.

Furthermore, it is possible to provide two thresholds in the binary circuit 11 as shown in FIG. 12. When the amplified sensor signal (at the point β) crosses a minimum threshold level Lmin in the increasing phase, the binary circuit 11 produces a H-level signal. When the amplified sensor signal crosses a maximum threshold level Lmax in the decreasing phase, the binary circuit 11 produces an L-level signal.

Moreover, application of the present invention is not limited to the magnetic rotational angle detecting apparatus and, therefore, can be applied to a semiconductor pressure sensor wherein an electric signal of a piezoelectric resistive element is amplified as a signal responsive to a measured pressure.

Second Embodiment

Figure 13:
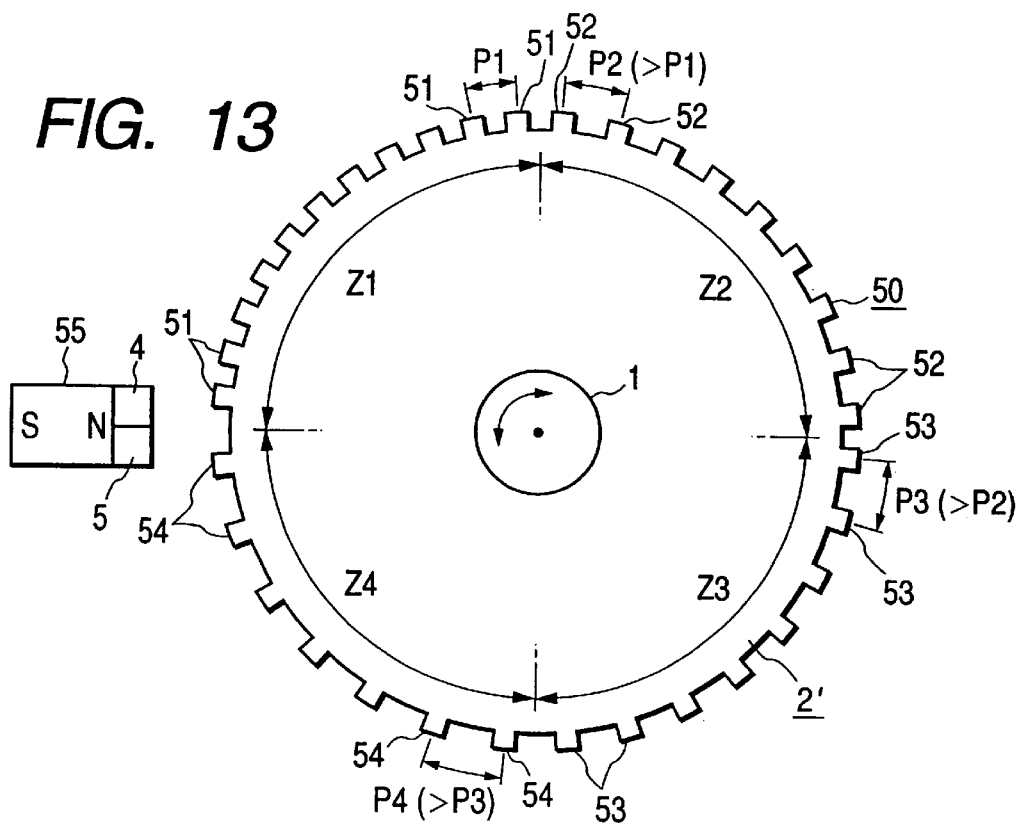
FIG. 13 is a diagram showing a magnetic rotational position detecting apparatus in accordance with a second embodiment of the present invention.

FIG. 13 shows another magnetic rotational position detecting apparatus. The shaft 1 rotates in synchronism with the engine output shaft (not shown). The rotational speed of the shaft 1 is a half of that of the engine output shaft. A gear 2', made of a magnetic member, is securely connected to the shaft 1. A plurality of teeth 50, including a total of four kinds of teeth 51, 52, 53 and 54, are provided along the outer periphery of the gear 2'. The teeth 51, 52, 53 and 54 are disposed in angular regions Z1, Z2, Z3 and Z4, respectively. Each angular region has a spread angle 90° (=360°/4) and extends in a circumferential direction about the shaft 1. The teeth 51, 52, 53 and 54 are different from each other in pitch. In the first region Z1, the teeth 51 are disposed at the narrowest pitches P1. In the second region Z2, the teeth 52 are disposed at the pitches P2 (P2>P1). In the third region Z3, the teeth 53 are disposed at the pitches P3 (P3>P2). In the fourth region Z4, the teeth 54 are disposed at the widest pitches P4 (P4>P3).

Figure 14:
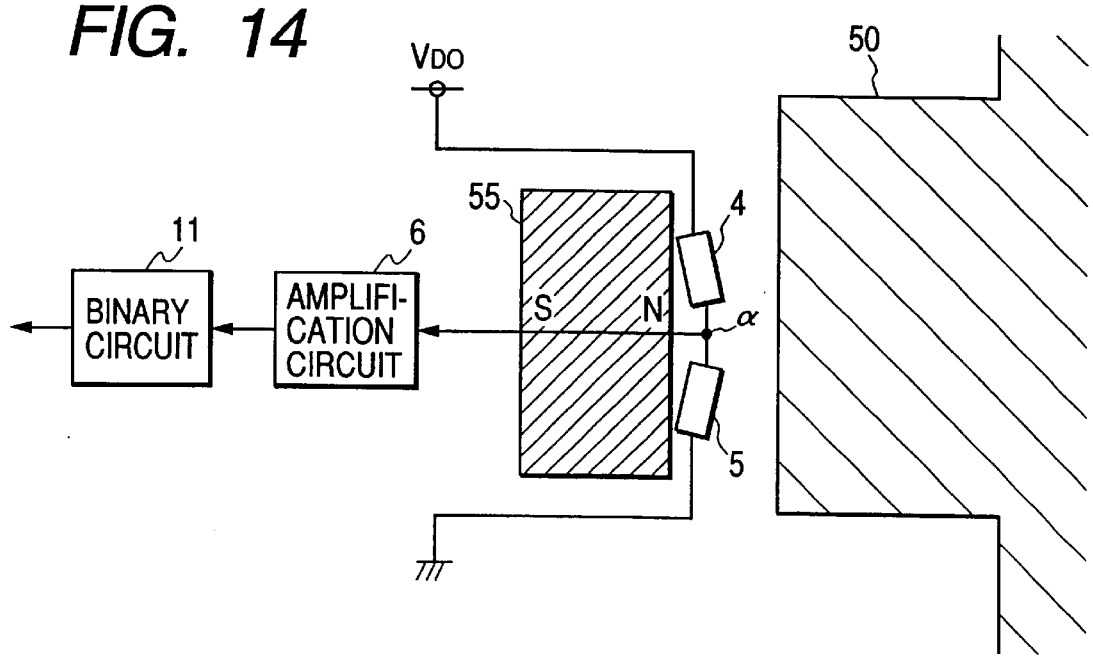
FIG. 14 is a diagram showing the positional relationship and electric arrangement of the magnetic rotational position detecting apparatus shown in FIG. 13.

A bias magnet 55, provided in the vicinity of the gear 2', generates a bias magnetic field. Two MREs (magnetic resistive elements) 4 and 5 are disposed between the gear 2' and the bias magnet 55 to detect the directional change of the bias magnetic field varying in accordance with the rotation of the gear 2'. As shown in FIG. 14, the sensor signal (i.e., the voltage of the intermediate Point α between the MREs 4 and 5) is entered into the amplification circuit 6. The amplification circuit 6 comprises two kinds of resistors, i.e., the gain-determining input resistor 8 and the gain-determining feedback resistor 9, to determine the amplification factor for amplifying the sensor signal. The binary circuit 11, connected to the amplification circuit 6, converts the amplified sensor signal (i.e., the output of the amplification circuit 6) into a binary signal. More specifically, the amplified sensor signal having a sine waveform is compared with a predetermined threshold to produce the binary signal based on the comparison.

The MREs 4 and 5 have temperature dependencies. The resistors 8 and 9 of the amplification circuit 6 have temperature dependencies opposed to those of the MREs 4 and 5 so that the amplified output signal of the amplification circuit 6 is not substantially influenced by the temperature characteristics of the MREs 4 and 5.

Figure 15:
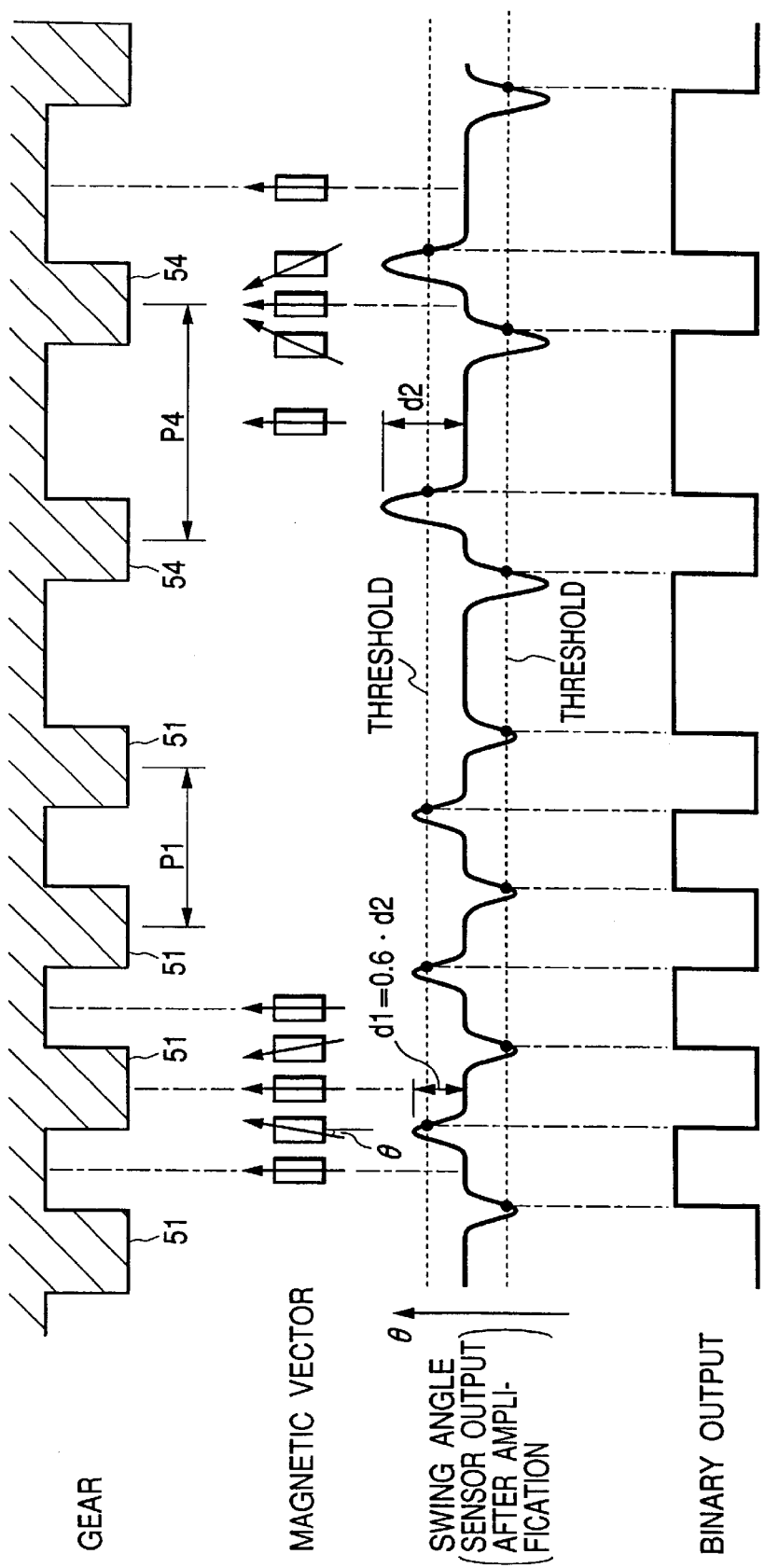
FIG. 15 is the development of the gear teeth and a related waveform of the magnetic rotational position detecting apparatus shown in FIG. 13.

More specifically, as shown in FIG. 15, the sensor output amplitude is variable in accordance with the gear teeth pitch because the directional change (i.e., the swing angle θ) of the bias magnetic field is proportional to the gear teeth pitch. In other words, the sensor output amplitude (d1) corresponding to the teeth 51 is smallest. The sensor output amplitude (d2) corresponding to the teeth 54 is largest. For example, d1=0.6×d2. The threshold level is set to be smaller than the sensor output amplitude (d2) corresponding to the teeth 51 so that all of the amplified sensor output signals can cross the threshold level in the operational temperature region of the position detecting apparatus.

According to this embodiment, the pitches of respective teeth 51, 52, 53 and 54 can be adequately set for the purpose of use.

In practical use, the actual threshold level may be deviated by a voltage difference ΔV (mV) from the designed (i.e., true) threshold level due to dispersion in the manufacturing process.

Figure 16A:
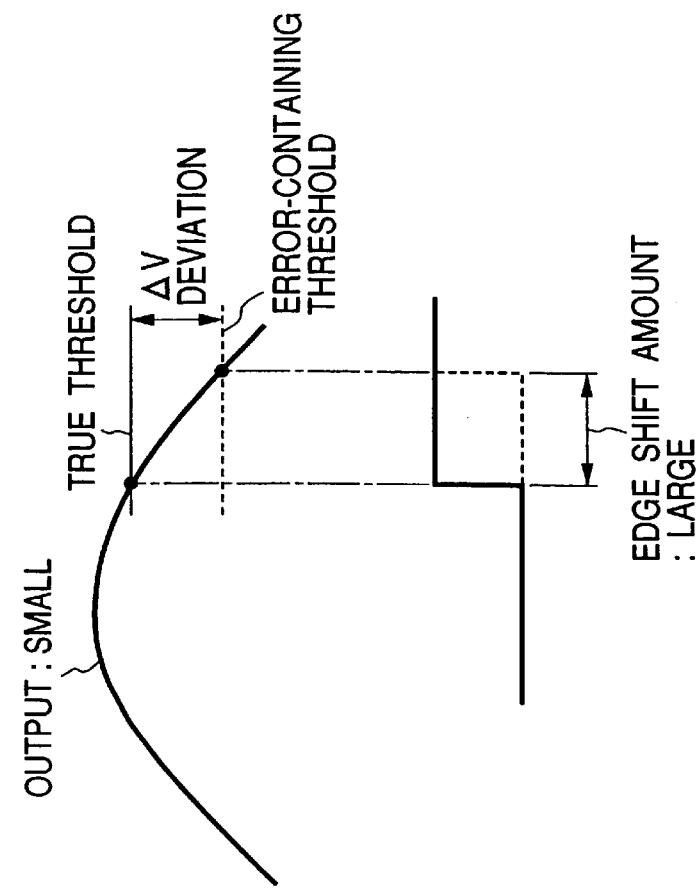
FIGS. 16A and 16B are views respectively showing the waveform of a sensor output signal.
Figure 16B:
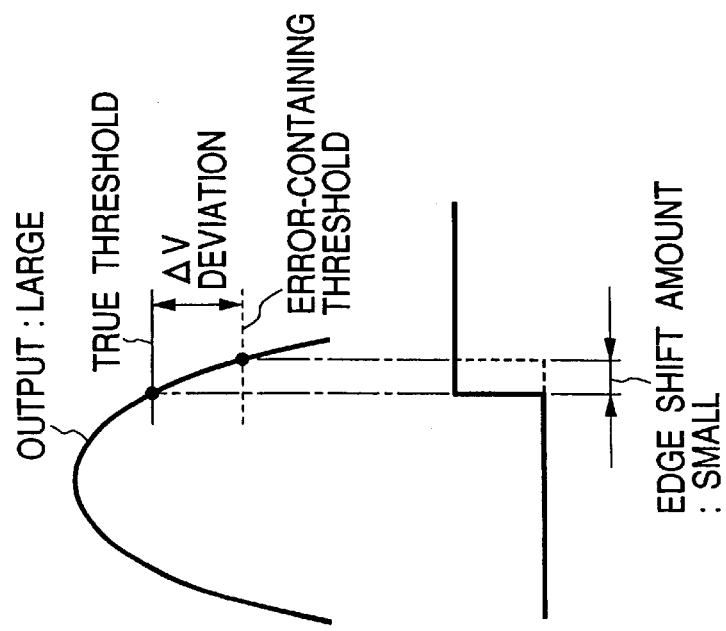

When the sensor output has a large amplitude, the slope of the sine waveform is steep and, therefore, the edge shift amount of the binary signal is small as shown in FIG. 16A. On the other hand, when the sensor output has a small amplitude, the slope of the sine waveform is moderate and, therefore, the edge shift amount of the binary signal is large as shown in FIG. 16B.

When the MREs 4 and 5 have negative temperature characteristics, the sensor output is small at high temperatures. The edge shift amount of the binary signal becomes so large that it exceeds the practical allowable limit.

However, the present invention cancels the temperature characteristics of the MREs 4 and 5 by the temperature characteristics of the gain of the operational amplifier 7 in the amplification circuit 6. Accordingly, it becomes possible to prevent the edge shift amount from increasing due to temperature change.

According to the arrangement shown in FIG. 14, the resistance value changes of the MREs 4 and 5 with respect to the bias magnetic field are opposite in phase. The resistance value R at the intermediate point α between the MREs 4 and 5 is expressed by the following equation (4).

$$R=(r5+\Delta r)/\{(r4-\Delta r)+(r5+\Delta r)\}=(r5+\Delta r)/(r4+r5) \quad (4)$$

where Δr represents a magnetic resistance change in each of the MREs 4 and 5, and r4 and r5 are fundamental resistance values of the MREs 4 and 5.

The magnetic resistance change Δr is variable in accordance with the temperature of the MREs 4 and 5. However, the gain of the operational amplifier 7 has the temperature dependency opposed to that of the MREs 4 and 5. Thus, it becomes possible to stabilize the amplified sensor output of the operational amplifier 7 (i.e., the voltage value at the point β) at a constant value regardless of temperature change.

This kind of rotational position detecting apparatus can be preferable used for detecting a cam shaft or crank shaft angle of an internal combustion engine of an automotive vehicle to precisely determine the ignition timing.

In general, the adverse influence of the temperature characteristics can be suppressed to a certain amount by enlarging the gain of the operational amplifier 7. However, there is the limit in enlarging the gain of each operational amplifier. In this respect, the temperature canceling function of the present invention is preferably applicable to the amplification circuit which includes an operational amplifier whose gain cannot be enlarged so much.

As described above, when the gear 2' serving as a rotary member of the detection object has the teeth 50 spaced by a plurality of pitches, the smallest pitch teeth 51 may produce a too much small sensor output. However, the present invention amplifies the sensor output by using the resistors 8 and 9 having the temperature characteristics opposed to those of the MREs 4 and 5. Thus, the present invention assures that the amplification circuit 6 produces the amplified sensor output having a sufficient amplitude. In other words, the resistors 8 and 9 satisfy a requirement that the amplified signal produced from the amplification circuit 6 has a level processible in the binary circuit 11 in an operating temperature range of the position detecting apparatus. Furthermore, in the signal processing in the binary circuit 11, the present invention suppresses the edge shifting amount of the binary signal so as to realize the accurate binary processing.

Figure 17:
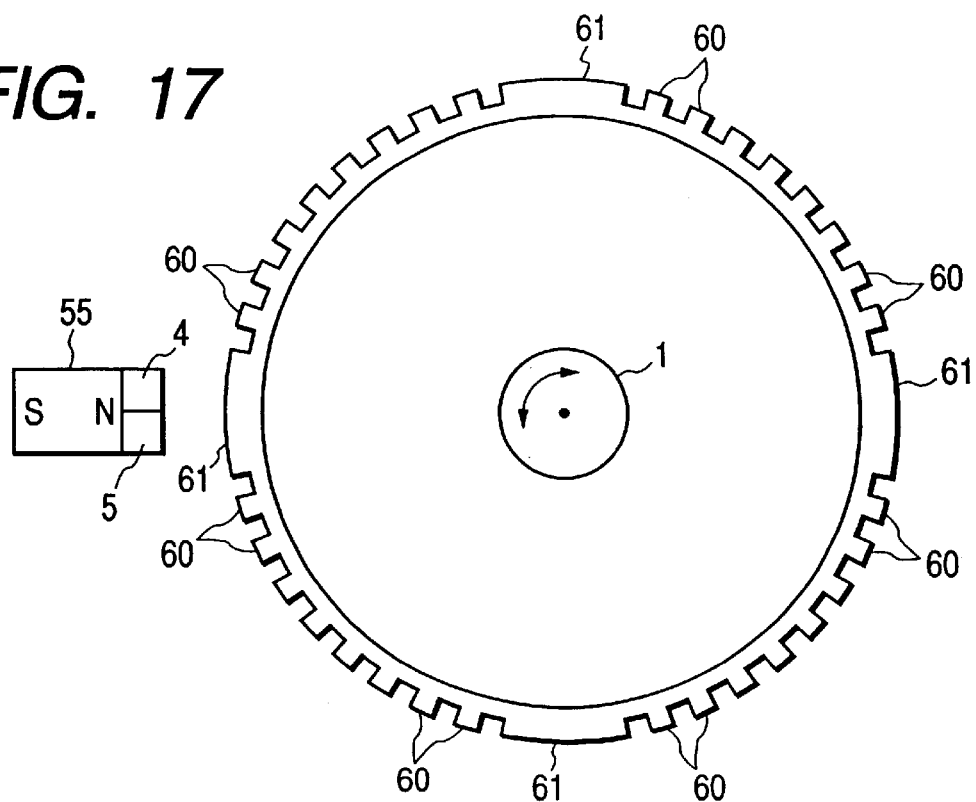
FIG. 17 is a diagram showing another magnetic rotational position detecting apparatus in accordance with the second embodiment of the present invention.
Figure 18:
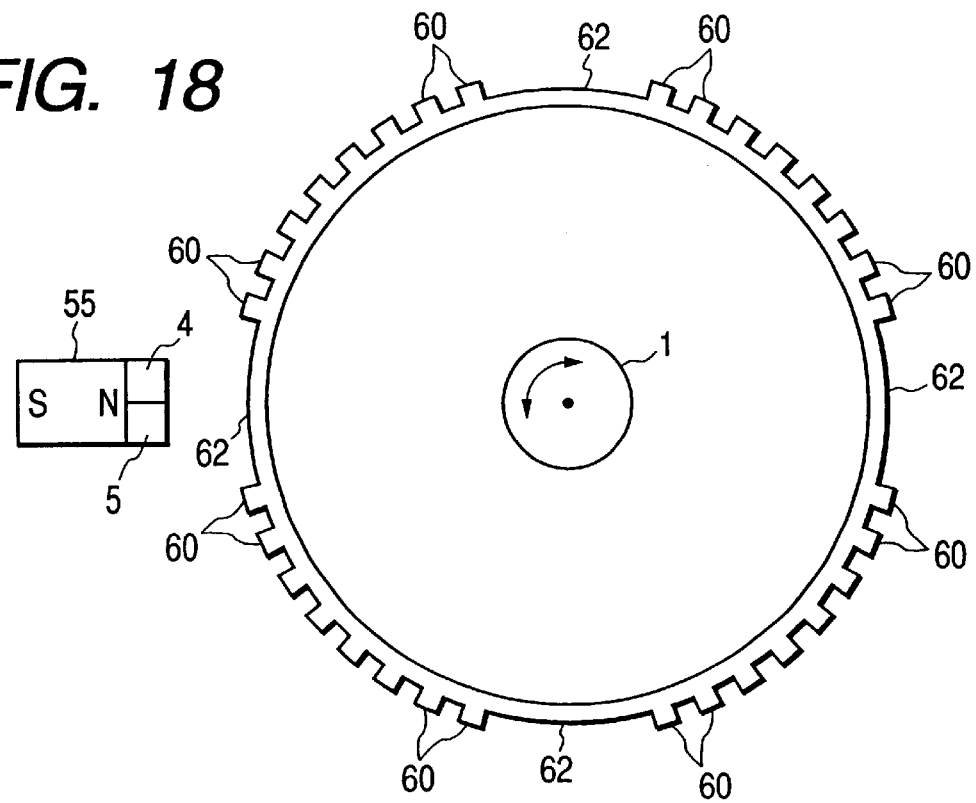
FIG. 18 is a diagram showing another magnetic rotational position detecting apparatus in accordance with the second embodiment of the present invention.

Application of the present invention is not limited to the gears 2 and 2' disclosed in FIGS. 1 and 13 and, therefore, can be applied to other rotary members for example shown in FIGS. 17 and 18. FIG. 17 shows a gear having smaller teeth 60 spaced at uniform intervals and large teeth 61 spaced at intervals of 90°. FIG. 18 shows another gear having teeth 60 spaced at uniform intervals and toothless portions 62 spaced at intervals of 90°.

Moreover, application of the present invention is not limited to the magnetic rotational position detecting apparatus and, therefore, can be applied to other apparatus including a linear sensor. The linear sensor is generally used to detect the position of a moving object shifting or reciprocating along a line.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An amplification circuit comprising:

an operational amplifier for inputting a sensing signal from a temperature-dependent element;

a gain-determining input resistor connected to an input terminal of said operational amplifier; and a gain-determining feedback resistor disposed in a feedback path extending from an output terminal of said operational amplifier to the input terminal of said operational amplifier;

wherein temperature characteristics of said gain-determining input resistor and said gain-determining feedback resistor are opposed to that of said temperature-dependent element, and the gain of said operational amplifier is defined by said gain-determining input resistor and said gain-determining feedback resistor so that temperature characteristics of said gain can cancel the temperature characteristics of said temperature-dependent element, and wherein said gain-determining input resistor and said gain-determining feedback resistor are impurity-diffusion resistive elements.

2. The amplification circuit in accordance with claim 1, wherein said temperature-dependent element is a magnetic detecting element which detects a magnetic field change responsive to the rotation of a rotor and produces an electric signal representing the detected magnetic field change.

3. The amplification circuit in accordance with claim 1, wherein said gain-determining input resistor and said gain-determining feedback resistor are different from each other in their temperature characteristics.

4. The amplification circuit in accordance with claim 1, wherein said gain-determining input resistor and said gain-determining feedback resistor are positive in their temperature characteristics.

5. The amplification circuit in accordance with claim 1, wherein said operational amplifier is constituted by a MOS process element having a P well region serving as said gain-determining feedback resistor and a P$^+$ region serving as said gain-determining input resistor.

6. The amplification circuit in accordance with claim 5, wherein said P well region and said P$^+$ region are located adjacent to each other in a semiconductor substrate.

7. A position detecting apparatus comprising:

a moveable member made of a magnetic material and having numerous teeth arrayed along a moving direction, said teeth including at least first teeth and second teeth arrayed at different intervals from each other;

bias magnetic field generating means, for generating a bias magnetic field adjacent to said moveable member;

a magnetic resistive element, disposed between said moveable member and said bias magnetic field generating means, for detecting the direction of said bias magnetic field varying in accordance with the movement of said moveable member;

an amplification circuit having two kinds of gain-determining resistive elements for amplifying a sensing signal obtained from said magnetic resistive element; and binary signal producing means for converting an amplified signal produced from said amplification circuit into a binary signal based on a comparison between said amplified signal and a predetermined threshold;

wherein said gain-determining resistive elements have temperature characteristics opposed to that of said magnetic resistive element so that the amplified signal produced from said amplification circuit is not substantially influenced by the temperature characteristics of said magnetic restrictive element, and wherein said gain-determining resistive elements are impurity-diffusion resistive elements.

8. The position detecting apparatus in accordance with claim 7, wherein the temperature characteristics of said gain-determining resistive elements satisfy a requirement that the amplified signal produced from said amplification circuit has a level processible in said binary signal producing means in an operating temperature range of the position detecting apparatus.

9. The position detecting apparatus in accordance with claim 7, wherein said movable member is a rotary member with teeth arrayed along its circumferential periphery.

10. A position detecting apparatus comprising:

a moveable member made of a magnetic material and having a plurality of teeth sections arrayed along a moving direction with non-edged regions separating said teeth sections, each teeth section including a plurality of teeth arrayed at uniform intervals and each non-edged region being formed into an elongated tooth or a toothless region;

bias magnetic field generating means for generating a bias magnetic field adjacent to said moveable member;

a magnetic resistive element, disposed between said moveable member and said bias magnetic field generating means, for detecting the direction of said bias magnetic field generating means varying in accordance with the movement of said moveable member;

an amplification circuit having two kinds of gain-determining resistive elements for amplifying a sensing signal obtained from said magnetic resistive element; and binary signal producing means for converting an amplified signal produced from said amplification circuit into a binary signal based on a comparison between said amplified signal and a predetermined threshold;

wherein said gain-determining resistive elements have temperature characteristics opposed to that of said magnetic resistive element, so that the amplified signal produced from said amplification circuit is not substantially influenced by the temperature characteristics of said magnetic resistive element, and wherein said gain-determining resistive elements are impurity-diffusion resistive elements.

11. The position detecting apparatus in accordance with claim 10, wherein the temperature characteristics of said gain-determining resistive elements satisfy a requirement that the amplified signal produced from said amplification circuit has a level processible in said binary signal producing means in an operating temperature range of the position detecting apparatus.

12. The position detecting apparatus in accordance with claim 10, wherein said movable member is a rotary member with teeth arrayed along its circumferential periphery.

* * * * *